(12) United States Patent
Raj et al.

(10) Patent No.: US 7,447,284 B2
(45) Date of Patent: Nov. 4, 2008

(54) METHOD AND APPARATUS FOR SIGNAL NOISE CONTROL

(75) Inventors: Raghu Raj, Austin, TX (US); Junsong Li, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 878 days.

(21) Appl. No.: 10/402,160

(22) Filed: Mar. 28, 2003

(65) Prior Publication Data

US 2004/0190659 A1 Sep. 30, 2004

(51) Int. Cl.
H03K 5/01 (2006.01)
(52) U.S. Cl. .................. 375/346; 375/229; 375/316; 375/350
(58) Field of Classification Search ........... 375/147, 375/148, 229, 232, 233, 316, 346, 350, 345; 329/318, 319, 320, 347, 349
See application file for complete search history.

(56) References Cited

U.S. PATENT DOCUMENTS

| | | | |
|---|---|---|---|
| 4,152,650 A * | 5/1979 | Bennett, Jr. ................. 380/38 |
| 4,210,871 A | 7/1980 | Hill et al. |
| 4,384,358 A | 5/1983 | Shiki et al. |
| 4,498,885 A * | 2/1985 | Namiki ...................... 455/273 |
| 4,764,730 A * | 8/1988 | Miyo et al. .................. 329/307 |
| 5,073,976 A * | 12/1991 | Kennedy ................... 455/161.3 |
| 5,113,446 A | 5/1992 | Kennedy |
| 5,203,023 A | 4/1993 | Saito et al. |
| 5,203,025 A | 4/1993 | Anvari et al. |
| 5,249,233 A | 9/1993 | Kennedy et al. |
| 5,263,180 A | 11/1993 | Hirayama et al. |
| 5,321,850 A | 6/1994 | Backstrom et al. |
| 5,487,091 A | 1/1996 | Jasper et al. |
| 5,513,222 A | 4/1996 | Iwasaki |
| 5,530,925 A | 6/1996 | Garner |
| 5,541,956 A * | 7/1996 | Ueda ........................... 375/232 |
| 5,586,168 A | 12/1996 | Bucalo et al. |

(Continued)

OTHER PUBLICATIONS

Efron et al., "Detection in Impulsive Noise Based on Robust Whitening," *IEE Transactions on Signal Processing*, Jun. 6, 1994, vol. 42, No. 6, pp. 1572-11576.

(Continued)

*Primary Examiner*—Chieh M Fan
*Assistant Examiner*—Siu M Lee
(74) *Attorney, Agent, or Firm*—Joanna G. Chiu; Susan C. Hill (57) ABSTRACT

One embodiment of the present invention relates to noise control of one or more signals. In one embodiment, impulsive-type noise events, such as multipath noise events or pops, may be detected and suppressed to reduce signal distortion. For example, in one embodiment related to a radio receiver (100), a predictor (436) having an adaptive filter (402) is used in combination with a fast attack slow decay mechanism (434) to provide noise control signals (352, 358) which may then be used to suppress noise events. In one embodiment, the fast attack slow decay mechanism includes applying a wide bandwidth filter at the onset of a noise event to quickly track variations in an error signal and applying a narrow wide bandwidth filter a peak of the noise event is detected in order to smooth variations in the error signal (410). This allows for improved psycho-acoustic perception. In one embodiment, the radio receiver is a mobile radio receiver.

17 Claims, 5 Drawing Sheets

U.S. PATENT DOCUMENTS

| | | | |
|---|---|---|---|
| 5,608,804 A * | 3/1997 | Hirano | 381/71.12 |
| 5,630,213 A | 5/1997 | Vannatta | |
| 5,631,958 A | 5/1997 | Reese et al. | |
| 5,659,572 A | 8/1997 | Schilling | |
| 5,697,083 A | 12/1997 | Sano | |
| 5,710,995 A | 1/1998 | Akaiwa et al. | |
| 5,970,105 A * | 10/1999 | Dacus | 375/344 |
| 6,067,295 A | 5/2000 | Bahai et al. | |
| 6,078,633 A | 6/2000 | Shiotsu et al. | |
| 6,094,422 A | 7/2000 | Alelyunas et al. | |
| 6,115,591 A | 9/2000 | Hwang | |
| 6,151,487 A | 11/2000 | Kim et al. | |
| 6,172,970 B1 | 1/2001 | Ling et al. | |
| 6,173,166 B1 | 1/2001 | Whitecar | |
| 6,460,150 B1 * | 10/2002 | Cideciyan et al. | 714/709 |
| 6,826,279 B1 * | 11/2004 | Alavi et al. | 379/406.08 |
| 6,907,064 B1 * | 6/2005 | Tokunaga et al. | 375/232 |
| 6,980,786 B1 * | 12/2005 | Groe | 455/314 |
| 2003/0215032 A1 * | 11/2003 | Langlais et al. | 375/345 |

OTHER PUBLICATIONS

Ricker et al., "Suppression of Impulsive Noise in Active Acoustic Time Series," *MTS/IEEE Conference and Exhibition*, Nov. 5-8, 2001, vol. 3, pp. 1615-1621.

U.S. Appl. No. 09/916,915 entitled "Receiver and Method Therefor," filed Jul. 27, 2001 and assigned to the current assignee hereof.

U.S. Appl. No. 09/916,685 entitled "Receiver and Method Therefor," filed Jul. 27, 2001 and assigned to the current assignee hereof.

U.S. Appl. No. 09/916,684 entitled "Receiver and Method Therefor," filed Jul. 27, 2001 and assigned to the current assignee hereof.

Treichler, John R. et al.; "A New Approacah to Multipath Correction of Constant Modulus Signals"; IEEE Transactions on Acoustics, Speech. And Signal Processing; Apr. 1983; pp. 459-472; vol., ASSP-31, No. 2; IEEE.

* cited by examiner

METHOD AND APPARATUS FOR SIGNAL NOISE CONTROL

RELATED APPLICATIONS

This is related to U.S. patent application Ser. No. 09/916,915, filed on Jul. 27, 2001, and entitled "Receiver and Method Therefor," U.S. patent application Ser. No. 09/916,685, filed on Jul. 27, 2001, and entitled "Receiver and Method Therefor," and U.S. patent application Ser. No. 09/916,684, filed on Jul. 27, 2001, and entitled "Receiver and Method Therefor" and are all assigned to the current assignee hereof.

FIELD OF THE INVENTION

The present invention relates generally to noise control, and, more particular, to noise control of one or more signals.

RELATED ART

In most types of signals, noise generally presents a problem by distorting the desired signal. This problem is present in many different type of systems. For example, in mobile FM/AM systems, multipath noise is one type of frequently encountered problem. In such systems, the radio signal undergoes fading due to the dynamic characteristics of the communication channel. As a result, the final audio signal contains many randomly occurring bursts, referred to as multipath noise or pops. These multipath pops can sound harsh and degrade the audio quality. One solution available today attempts to address these multipath pops prior to demodulation of the received signal. However, it is found that such a scheme is not adequate to solve the problem. Therefore, a need exists for a method and apparatus which provides improved noise control of one or more signals.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Brackets are used to indicate the conductors of a bus or the bit locations of a value. For example, "bus 60 [0-7]" or "conductors [0-7] of bus 60" indicates the eight lower order conductors of bus 60, and "address bits [0-7]" or "ADDRESS [0-7]" indicates the eight lower order bits of an address value. The symbol "$" preceding a number indicates that the number is represented in its hexadecimal or base sixteen form. The symbol "%" preceding a number indicates that the number is represented in its binary or base two form.

One embodiment of the present invention relates to noise control of one or more signals. Since different types of noise events typically distort the desired signal or signals, one embodiment of the present invention detects and suppresses these noise events. In one embodiment, impulsive-type noise events, such as multipath noise events or pops, may be detected and suppressed to reduce signal distortion. Impulsive-type noise events can occur in many different type of systems. For example, impulsive-type noise events are particularly problematic in mobile radios. That is, as described above, multipath noise events or pops are generally problematic in systems such as mobile AM/FM radios. Therefore, in the discussions that follow, FIGS. 1-6 will be described primarily in reference to radio receivers; however, it should be understood that the noise control methods and systems described herein can apply to a variety of different systems and is not limited to radio receivers. Furthermore, the radio receiver of FIG. 1 can refer to any type of receiver, including mobile and stationary radio receivers, as will become more apparent in the descriptions that follow.

Figure 1:
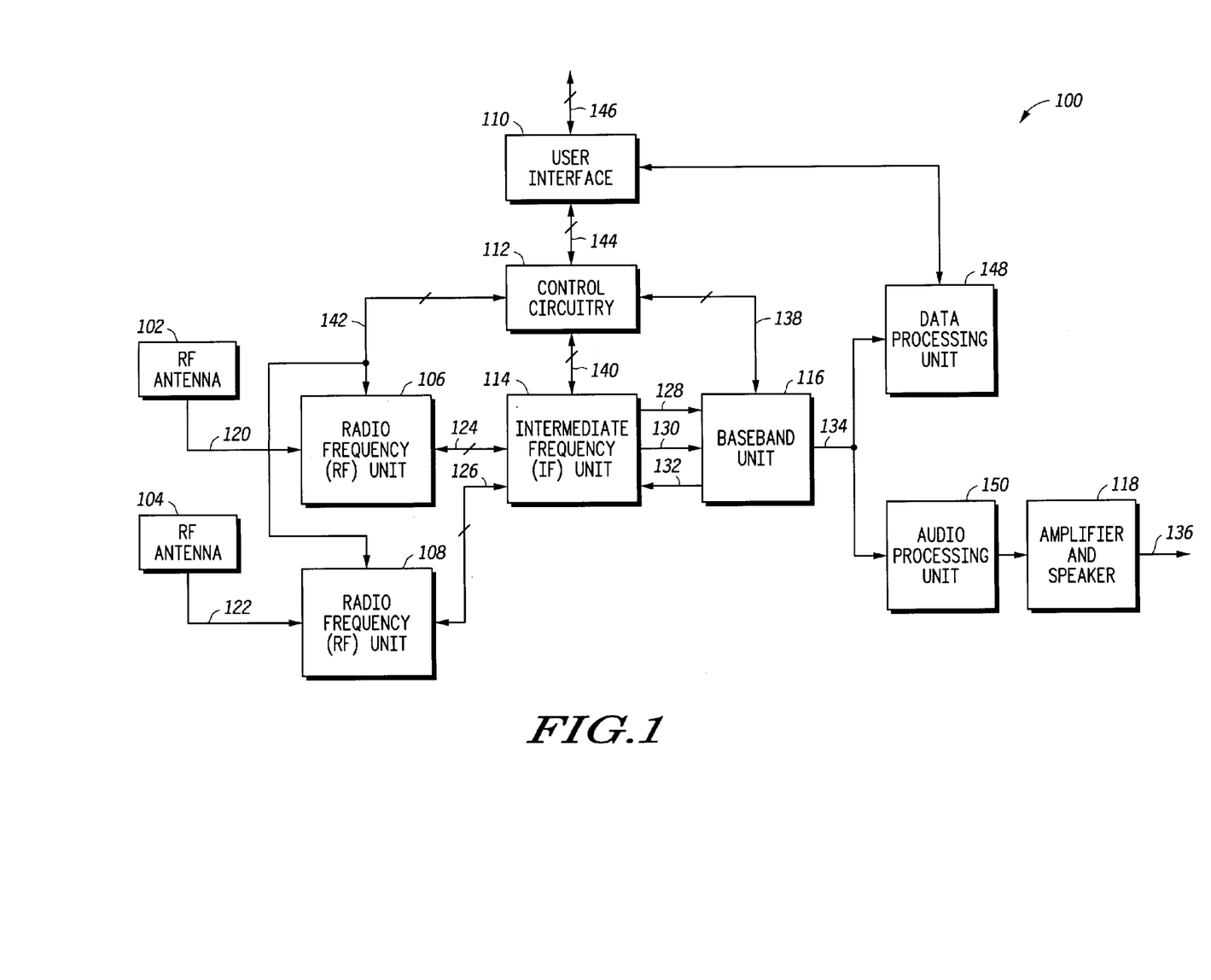
FIG. 1 illustrates, in block diagram form, a radio receiver in accordance with one embodiment of the present invention.

FIG. 1 illustrates a radio receiver in accordance with one embodiment of the present invention. Radio receiver 100 includes user interface 110 bi-directionally coupled via conductors 144 to control circuitry 112. Control circuitry 112 is bi-directionally coupled to radio frequency (RF) units 106 and 108 via conductors 142, to intermediate frequency (IF) unit 114 via conductors 140, and baseband unit 116 via conductors 138. RF Unit 106 is coupled to RF antenna 102 via conductor 120 and is bi-directionally coupled to IF unit 114 via conductors 124. RF Unit 108 is coupled to RF antenna 104 via conductor 122 and is bi-directionally coupled to IF unit 114 via conductors 126. IF unit 114 is coupled to base band unit 116 via conductors 128, 130 and 132. Base band unit 116 is coupled to audio processing unit 150 and data processing unit 148 via conductor 134. Audio processing unit 150 is coupled to amplifier and speaker 118 which provides output signals via conductor 136. Data processing unit 148 is bidirectionally coupled to user interface 110. Also, users may provide and receive information to and from user interface 110 via conductors 146.

In operation, RF antennas 102 and 104 capture radio signals and provide them to RF Units 106 and 108, respectively. RF Units 106 and 108 translate the received radio signals to a common intermediate frequency range as dictated by the design of the radio receiver. That is, RF Units 106 and 108 may translate the frequency of the received radio signals to a lower frequency or to a higher frequency depending on the requirements of IF Unit 114. IF unit 114 receives the RF signals via conductors 124 and 126 and digitizes them through the use of an analog to digital converter. IF unit 114 also performs digital mixing to produce in-phase and quadrature digitized signals which are output via conductors 128 and 130 to base band unit 116. In alternate embodiments, IF unit 114 is optional. That is, RF units 106 and 108 may translate the received radio signals from antennas 102 and 104 directly to base band and may include an analog to digital converter to provide the digitized base band signals directly to base band unit 116. (Also note that RF units 106 and 108 and IF unit 114, if used, may be referred to as a "lower frequency unit" or "higher frequency unit" depending on whether the received radio signals need to be translated to a lower or higher frequency, respectively.)

Base band unit 116 receives the digitized radio signals from intermediate frequency unit 114 or, if no IF unit exists, directly from RF units 106 and 108. Base band unit 116 performs signal conditioning, demodulation, and decoding in order to produce audio and data information via conductor 134. The processing performed by base band unit 116 will be further described in reference to later figures. Audio information via conductor 134 may be provided to audio processing unit 150 which may be coupled to amplifier and speaker 118 to produce an audio output from receiver 100 via conductor 136. For example, this may be music played from radio speakers. Alternatively, base band unit 116 may output data information via conductor 134 to data processing unit 148 for further processing. The output of data processing unit 148 may be coupled to user interface 110 to allow user interaction with the output of receiver 100. For example, user interface 110 may represent a radio dial, a touch screen, monitor and keyboard, keypad, or any other suitable input/output device. The data information may represent text, graphics, or any other information transmitted in digital form.

In alternate embodiments, radio receiver 100 may be used for different formats of data such as AM, FM, GPS, digital T.V., T.V., digital/audio broadcast, audio broadcast, digital/video broadcast, or the like. Furthermore, receiver 100 may be designed to receive frequencies other than radio frequencies. Antennas 102 and 104 may therefore be referred to as sensors capable of sensing a variety of data formats. Furthermore, each of the sensors or antennas in the system may receive different formats of data so that, for example, one sensor may receive radio signals while other sensors may receive different types of data as listed above. Also, receiver 100 of FIG. 1 illustrates two sensors or antennas (e.g. antennas 102 and 104); however, alternate embodiments may use any number of sensors for capturing signals or information. For example, in one embodiment, receiver 100 may include only one sensor for capturing a signal. Also, note that receiver 100 may either be a stationary or a mobile receiver.

Figure 2:
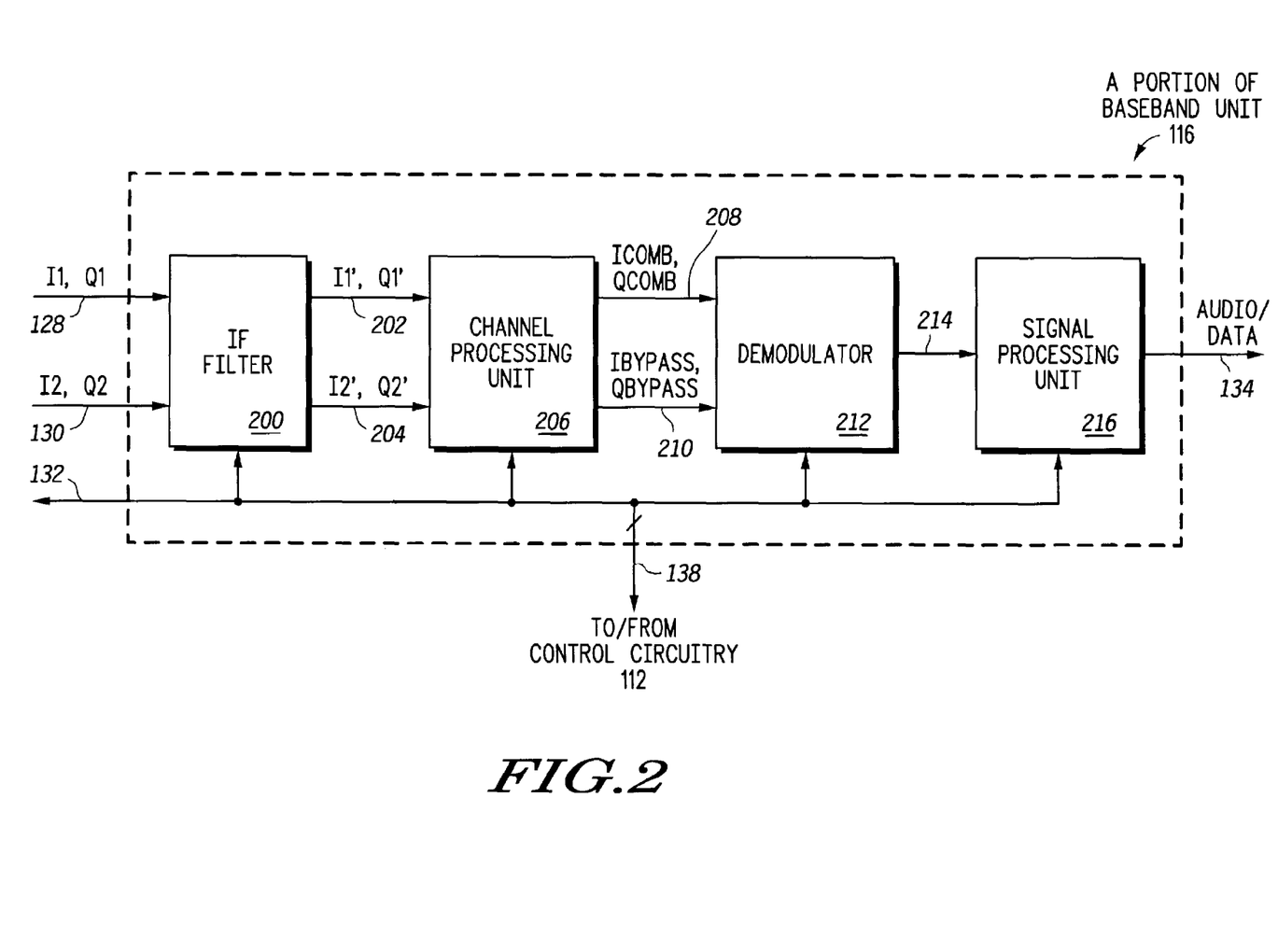
FIG. 2 illustrates, in block diagram form, a portion of a baseband unit of FIG. 1, according to one embodiment of the present invention.

FIG. 2 illustrates one embodiment of a portion of baseband unit 116. IF filter 200 receives in-phase and quadrature signal pairs I1, Q1 and I2, Q2 via conductors 128 and 130, respectively, where I1, Q1 corresponds to the signal received via sensor or antenna 102 and I2, Q2 corresponds to the signal received via sensor or antenna 104. I1 and I2 represent the digitized in-phase signals while Q1 and Q2 represent the digitized quadrature signals (e.g. signals that are 90 degrees out of phase as compared to the in-phase signals). (Note also that each signal such as I1, Q1 and I2, Q2 can be represented as a complex number where I1 and I2 represent the real portions and Q1 and Q2 represent the imaginary portions, as will be discussed further below.) IF filter 200 is coupled to channel processing unit 206 via conductors 202 and 204. Channel processing unit 206 is coupled to demodulator 212 via conductors 208 and 210, and demodulator 212 is coupled to signal processing unit 216 via conductor 214. Signal processing unit 216 provides audio/data information via conductor 134. IF filter 200, channel processing unit 206, demodulator 212, and signal processing unit 216 are coupled to control circuitry 112 via conductors 138. Conductors 138 may be referred to as a control bus including a variety of conductors for transferring different signals to and from units 200, 206, 212 and 216. Conductor 132, for example, may include a subset of conductors 138 or may be the full bus 138 which is provided back to intermediate frequency unit 114. Therefore, control signals received via conductor 138 may be transmitted to IF frequency unit 114 via conductor 132. Likewise, these control signals or subsets of these signals may be transmitted back to the RF units 106 and 108 via conductors 124 and 126. Alternatively, control signals may be sent directly from control circuitry 112 to radio frequency units 106 and 108 via conductor 142.

In operation, IF filter 200 removes unwanted signals and noise from the desired frequency range of incoming signals I1, Q1, and I2, Q2. IF filter 200 also suppresses adjacent channels in order to produce filtered in-phase and quadrature signal pairs I1', Q2', and I2', Q2', where I1', Q1' corresponds to I1, Q1 and I2', Q2' corresponds to I2, Q2. Channel processing unit 206 receives I1', Q1' and I2', Q2' and combines these to produce a single combination signal Icomb, Qcomb. Alternatively, channel processing unit 206 may also provide one of its incoming signals such as I1', Q1' or I2', Q2' directly to demodulator 212 via conductor 210 as Ibypass, Qbypass. Therefore, channel processing unit 206 provides the option of combining its incoming digitized signals or bypassing them directly to further processing units such as demodulator 212. Channel processing unit 206 may also provide both a combined signal such as Icomb, Qcomb and a bypass signal such as Ibypass, Qbypass. Channel processing unit 206 and Ibypass, Qbypass also provide the ability to receive different types of signal formats such that one signal, such as I1', Q1', may be processed by channel processing unit 206 and output via conductor 208 while a second signal, such as I2', Q2', may be a different signal format that is directly bypassed to demodulator 212. (Alternatively, I1', Q1' may be output via conductor 208 without being processed by channel processing unit 206). This allows channel processing unit 206 to provide either a single combination signal or various different signals for further processing. For example, one antenna may provide signals from one radio station while a second antenna may provide signals from a second radio station or of a different data format all together. Channel processing unit 206 may also perform noise canceling on the received signals.

Also note that the embodiment illustrated in FIG. 2 illustrates only two signals received by IF filter 200 and channel processing unit 206. However, as was discussed in reference to FIG. 1, receiver 100 may include any number of antennas such as 102 and 104. In one embodiment, receiver 100 may include only one antenna where channel processing unit 206 only receives one signal pair (such as I1', Q1') and thus provides only one signal, I1', Q1', as Icomb, Qcomb (since there would not be other signals to be combined with I1', Q1') to demodulator 212. In this embodiment, a bypass signal (such as Ibypass, Qbypass) may not be necessary and may therefore not be present in baseband unit 116. In an alternate embodiment, receiver 100 can have 2 or more antennas where each antenna would provide its own in-phase and quadrature signal pair such as I1, Q1 to IF filter 200. In this embodiment, IF filter 200 may provide a plurality of filtered in-phase and quadrature signal pairs corresponding to each of the antennas. In this manner, channel processing unit 206 may output a single combination signal or multiple subcombinations of signals, as appropriate. Also, channel processing unit 206 may provide multiple bypass signals so that more than one incoming signal may be directly bypassed to further processing units such as demodulator 212.

Demodulator 212 receives signals Icomb, Qcomb and Ibypass, Qbypass from channel processing unit 206 and provides demodulated signals to signal processing unit 216 via conductor 214. Also, if demodulator 212 receives signals Ibypass, Qbypass, demodulator 212 may provide a demodulated Ibypass, Qbypass, also via conductor 214 to signal processing unit 216. However, as discussed above, Ibypass, Qbypass is optional. For example, in one embodiment, demodulator 212 may be an FM demodulator providing multiplex (MPX) signals corresponding to each of its incoming signals (e.g. Icomb, Qcomb and Ibypass, Qbypass). In alternate embodiments, demodulator 212 may be an AM demodulator or a demodulator specific to any other signal format as required by the system (e.g. receiver 100) and incoming signals I1, Q1 and I2, Q2. Signal processing unit 216 may perform further processing on the signals received via conductor 214 and outputs audio/data information via conductor 134. Audio/data information may include just audio information, just data information or a combination of both audio and data information. This data may then be output to various different systems such as data processing systems or audio processing systems, as illustrated in FIG. 1.

For example, in an FM receiver, demodulator 212 outputs an MPX signal to signal processing unit 216 as discussed above. In this embodiment, signal processing unit 216 receives the MPX signal and performs stereo decoding in order to provide the proper signals to each speaker. For example, the MPX signal may be decoded utilizing a pilot tone to provide left and right speaker signals in a stereo system. Also, signal processing unit 216 may demodulate other sub-carrier signals (e.g. RDS or DARC) to provide further information to subsequent processing units. Operation of signal processing unit 216 will be described in more detail below in reference to FIGS. 3-6. Note that the discussion of signal processing unit 216 will use the example of an FM receiver where conductor 214 provides an MPX signal to signal processing unit 216 in order to obtain an audio output for speakers. For example, as will be discussed below, signal processing unit 216 may be used to detect and remove multipath noise from a demodulated FM audio signal. However, in alternate embodiments, signal processing unit 216 may be used to detect and remove noise from a demodulated AM audio signal. Alternatively, signal processing unit 216 may be used to detect and remove other types of noise, such as, for example, impulsive-type noise, from one or more signals. Therefore, note that signal processing unit 216 may be used in a variety of different applications in order to detect and suppress noise.

Note that in the discussions of FIGS. 3-6 that follow, the numbers used to label connections between blocks may also be used to refer to the signal or signals that are communicated between the blocks.

Figure 3:
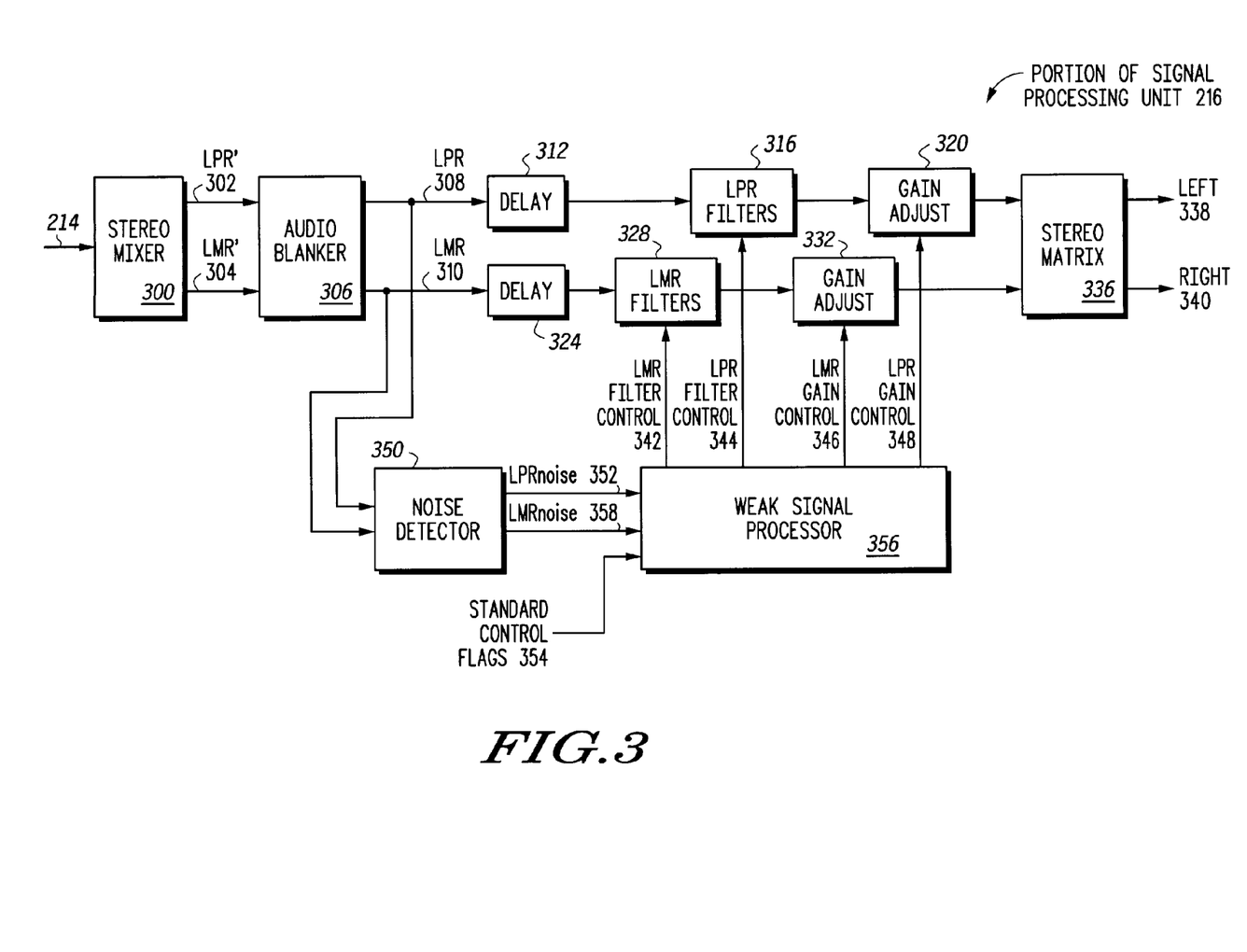
FIG. 3 illustrates, in block diagram form, a portion of a signal processing unit of FIG. 2 according to one embodiment of the present invention.

FIG. 3 illustrates, in block diagram form, a portion of signal processing unit 216, in accordance with one embodiment of the present invention. Signal processing unit 216 includes stereo mixer 300, audio blanker 306, delays 312 and 324, LPR filter 316, LMR filter 328, gain adjusts 320 and 332, stereo matrix 336, noise detector 350, and weak signal processor 356. Stereo mixer 300 is coupled to conductor 214 and coupled to provide LPR' 302 and LMR' 304 to blanker 306. Blanker 306 provides LPR 308 and LMR 310 to delay 312 and delay 324, respectively, and to noise detector 350. Delay 312 is coupled to LPR filter 316, which is coupled to gain adjust 320, which is coupled to stereo matrix 336. Delay 324 is coupled to LMR filter 328, which is coupled to gain adjust 332, which is coupled to stereo matrix 336. Stereo matrix 336 provides left signal 338 and right signal 340 (which correspond to left and right stereo signals that may be provided to data processing unit 148 and/or audio processing unit 150 of FIG. 1). Noise detector 350 provides LPRnoise 352 and LMRnoise 358 to weak signal processor 356. Weak signal processor 356 also receives standard control flags 354 and provides LMR filter control 342 to LMR filter 328, LPR filter control 344 to LPR filter 316, LMR gain control 346 to gain adjust 332, and LPR gain control 348 to gain adjust 320.

In operation (described in reference to an FM signal as an example), a demodulated MPX signal (from demodulator 212) is received via conductor 214. In one embodiment, prior to providing the MPX signal to stereo mixer 300, the MPX signal may be filtered and decimated. For example, the MPX signal may be filtered by an anti-aliasing filter prior to decimation by an appropriate value. For example, in one embodiment, the MPX signal may be decimated by 5 to reduce the sampling rate of the MPX signal. The demodulated and decimated (optional) MPX signal is provided to stereo mixer 300 which generates LPR' 302 (corresponding to the left plus right signal) and LMR' 304 (corresponding to the left minus right signal). Note that both signals LPR' 302 and LMR' 304 are generated such that they are both baseband signals. Operation of stereo mixer 300 will not be discussed in detail because any algorithm known in the art may be used to generate LPR' 302 and LMR' 304.

LPR' 302 and LMR' 304 are provided to audio blanker 306 which detects and suppresses the periodic ignition noise from an automobile having receiver 100. Note that audio blanker 306 is generally used when receiver 100 is used as a car radio. Therefore, audio blanker may be optional if no periodic noise is present. In the case where periodic ignition noise is present, any type of audio blanker 306 known in the art may be used to detect and suppress the periodic ignition noise. Audio blanker 306 therefore processes LPR' 302 and LMR' 304 and outputs LPR 308 and LMR 310, respectively. Note that if audio blanker 306 is not needed or is not present, LPR' 302 and LMR' 304 are provided as LPR 308 and LMR 310 directly. Also, note that LPR 308 and LMR 310 may also be referred to as post-demodulated signals 308 and 310, respectively.

LPR 308 is processed via delay 312, LPR filter 316, and gain adjust 320, and then provided to stereo matrix 336. LPR 308 is delayed by delay 312 to produce a delayed LPR signal which is then provided to LPR filter 316. Delay 312 provides a delay that is approximately equivalent to the delay introduced by noise detector 350 and weak signal processor 356. In this manner, the control signals LPR filter control 344 and LPR gain control 348 are applied to LPR filter 316 and gain adjust 320, respectively, at the appropriate point in time such that the controls 344 and 348 are time aligned with LPR 308.

LPR filter 316 receives the delayed LPR signal and provides a filtered LPR signal to gain adjust 320. In one embodiment, LPR filter 316 is a variable filter (e.g. a variable low pass filter) used to remove high frequency noise. The variable low pass filter is controlled, in this embodiment, by LPR filter control 344 received from weak signal processor 356. (Note that generation of LPR filter control 344 will be described in more detail below.) Gain adjust 320 receives the filtered LPR signal and provides a gain adjusted LPR signal to stereo matrix 336. In one embodiment, gain adjust 320 is a variable gain adjuster, where the gain is determined by LPR gain control 348 received from weak signal processor 356. (Note that generation of LPR gain control 348 will be described in more detail below.) Therefore, the input to stereo matrix 336 from gain adjust 320 is a delayed, filtered, and gain adjusted version of LPR 308.

Similarly, LMR 310 is processed via delay 324, LMR filter 328, and gain adjust 332, and then provided to stereo matrix 336. LMR 310 is delayed by delay 324 to produce a delayed LPR signal which is then provided to LPR filter 328. Delay 324 provides a delay that is approximately equivalent to the delay introduced by noise detector 350 and weak signal processor 356. In this manner, the control signals LMR filter control 342 and LMR gain control 346 are applied to LMR filter 328 and gain adjust 332, respectively, at the appropriate point in time such that the controls 342 and 346 are time aligned with LMR 310. LMR filter 328 receives the delayed LMR signal and provides a filtered LMR signal to gain adjust 332. In one embodiment, LMR filter 328 is a variable filter (e.g. a variable low pass filter) used to remove high frequency noise. The variable low pass filter is controlled, in this embodiment, by LMR filter control 342 received from weak signal processor 356. (Note that generation of LMR filter control 342 will be described in more detail below.) Gain adjust 332 receives the filtered LMR signal and provides a gain adjusted LMR signal to stereo matrix 336. In one embodiment, gain adjust 332 is a variable gain adjuster, where the gain is determined by LMR gain control 346 received from weak signal processor 356. (Note that generation of LMR gain control 346 will be described in more detail below.) Therefore, the input to stereo matrix 336 from gain adjust 332 is a delayed, filtered, and gain adjusted version of LMR 310.

Stereo matrix 336 receives the delayed, filtered, and gain adjusted versions of LPR 308 and LMR 310 and processes them to provide left signal 338 and right signal 340, where left signal 338 is an audio signal obtained by adding the delayed, filtered, and gain adjusted versions of LPR 308 and LMR 310 and the right signal 340 is an audio signal obtained by subtracting the delayed, filtered, and gain adjusted version of LMR 310 from the delayed, filtered, and gain adjusted version of LPR 308. Therefore, in one embodiment, left signal 338 and right signal 340 may be provided to audio processing unit 150 for any further processing, or, may be provided directly to amplifier and speaker 118 if no further audio processing is required. Alternatively, left signal 338 and right signal 340 may be provided to data processing unit 148 for storage or further processing. In yet another embodiment, left signal 338 and right signal 340 may be provided to both audio processing unit 150 and data processing unit 148.

LPR 308 and LMR 310 at the output of audio blander 306 (or, if not present, at the output of stereo mixer 300) are also provided to noise detector 350 which generates LPRnoise 352 and LMRnoise 358 based on LPR 308 and LMR 310. In one embodiment, LPRnoise 352 and LMRnoise 358 are noise related control signals that provide information regarding one or more of the time location, magnitude, and duration of a noise event. In one embodiment, a noise event can refer to an occurrence of a particular type of noise. For example, in one embodiment, each of these signals provides information regarding the time location, magnitude, and duration of an impulsive-type noise event, such as multipath noise event. Alternatively, these signals may provide any type of information in addition to or in place of time location, magnitude, and duration regarding any type of noise event. Note also that in one embodiment, each of LPRnoise 352 and LMRnoise 358 are single signals that contain information regarding one or more of the time location, magnitude, and duration. Alternatively, each of LPRnoise 352 and LMRnoise 358 may include a plurality of signals or flags containing this information. Alternatively, a subset of this information maybe provided either in one signal or a plurality of signals.

LPRnoise 352 and LMRnoise 358, in addition to standard control flags 354, are provided to weak signal processor 356 which generates LMR filter control 342, LPR filter control 344, LMR gain control 346, and LPR gain control 348. Therefore, using the noise control information (such as, for example, time location, duration, and magnitude information) provided by LPRnoise 352 and LMRnoise 358, and signal strength information (RSSI) and ultrasonic noise information (USN) provided by standard control flags 354, weak signal processor 356 is able to generate controls 342, 344, 346, and 348. Alternate embodiments may use more or less or different information than those: listed above.

Operation of noise detector 350 and weak signal processor 356 will be discussed in more detail in reference to FIGS. 4-6 below. Also, although FIG. 3 illustrates both LPRnoise 352 and LMRnoise 358 as being generated by noise. detector 350, in alternate embodiments, noise detector 350 may generate only one of LPRnoise 352 and LMRnoise 358. In this case, only one of LPR 308 and LMR 310 may need to be provided to noise detector 350. Also, in this embodiment, weak signal processor 356 may generate controls 342, 344, 346, and 348 based on the one of LPRnoise 352 and LMRnoise 358 provided by noise detector 350. These alternate embodiments will also be explained in more detail in reference to FIGS. 4-6 below.

Figure 4:
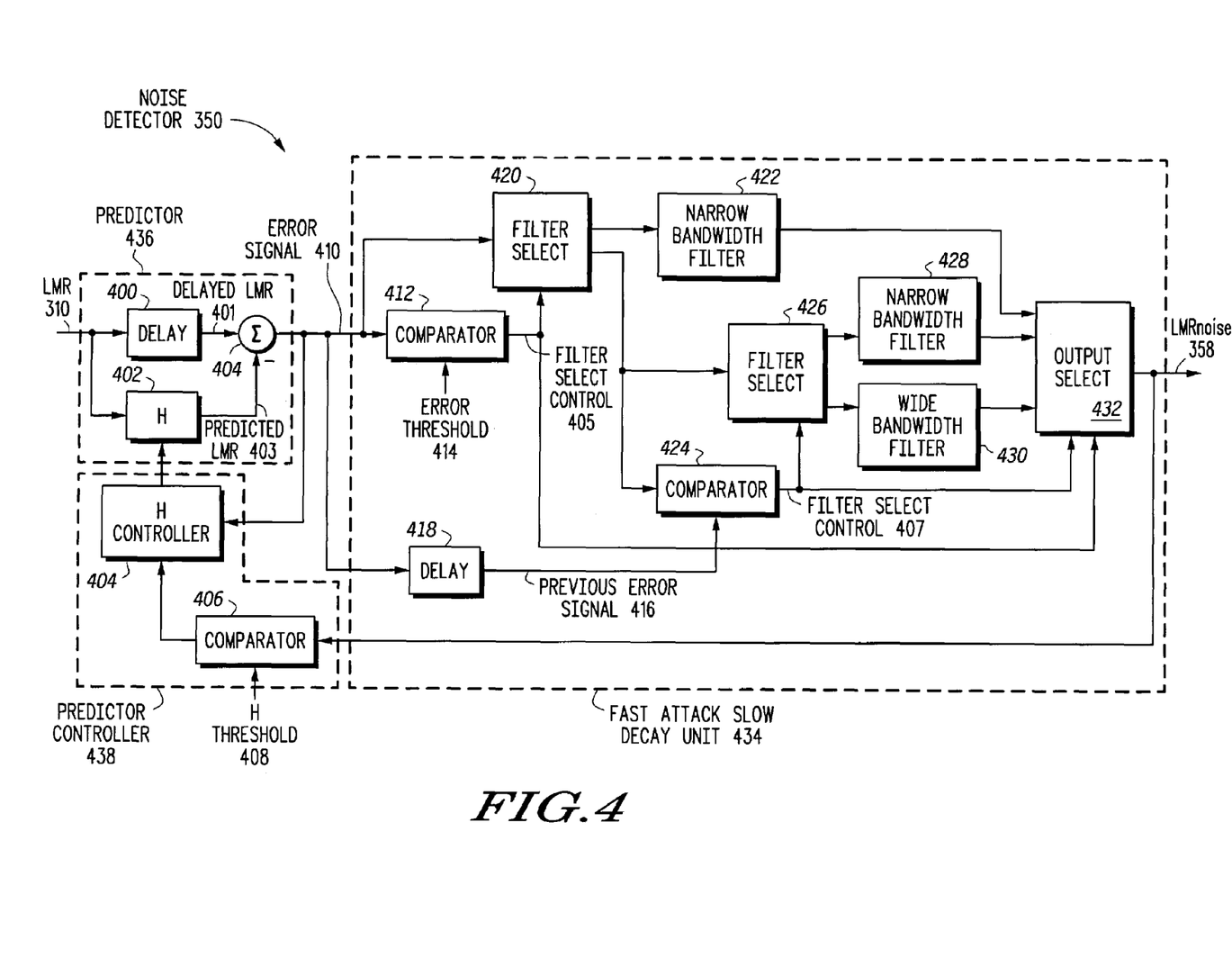
FIG. 4 illustrates, in block diagram form, a multipath noise detector of FIG. 3 having a predictor, a predictor controller, and a fast attack slow decay unit in accordance with one embodiment of the present invention.

FIG. 4 illustrates in block diagram form one embodiment of noise detector 350. Noise detector 350 includes a predictor 436, a fast attack slow decay unit 434, and a predictor controller 438. Noise detector 350 is coupled to fast attack slow decay unit 434 and predictor controller 438. Fast attack slow decay unit 434 also provides LMRnoise 358 to predictor controller 438. Predictor 436 includes a delay 400, an adaptive filter H 402 and a summer 404. Delay 400 receives LMR 310 and provides delayed LMR 401 to a positive input of summer 404. Adaptive filter H 402 receives LMR 310 and provides predicted LMR 403 to a negative input of summer 404. Summer 404 outputs error signal 410 as the difference between delayed LMR 401 and predicted LMR 403. Predictor Controller 438 includes an H controller 404 and a comparator 406. H controller 404 is coupled to adaptive filter H 402 and comparator 406. Comparator 406 receives H threshold 408 and LMRnoise 358. Fast attack slow decay unit 434 includes comparator 412, delay 418, filter select 420, comparator 424, filter select 426, narrow bandwidth filters 422 and 428, wide bandwidth filter 430, and output select 432. Comparator 412 is coupled to receive error signal 410 and to provide filter select control 405 to filters select 420 and output select 432. Delay 410 is coupled to receive error signal 410 and provide previous error signal 416 to comparator 424. Filter select 420 is coupled to receive error signal 410 and coupled to narrow bandwidth filter 422, filter select 426, and comparator 424. Comparator 424 is coupled to provide filter select control 407 to filter select 426 and output select 432. Narrow bandwidth filter 422 is coupled to output select 432. Narrow bandwidth filter 428 is coupled to filter select 426 and output select 432. Wide bandwidth filter 430 is coupled to filter select 426 and output select 432. Output select 432 is coupled to provide LMRnoise 358 to predictor controller 438 and weak signal processor 356.

In operation, noise detector 350 may be used to detect and suppress noise events which occur in LMR 310. For example, in one embodiment, noise detector 350 may detect and suppress multipath noise events. Operation of FIG. 4 will be described in conjunction with flow 500 of FIG. 5.

Figure 5:
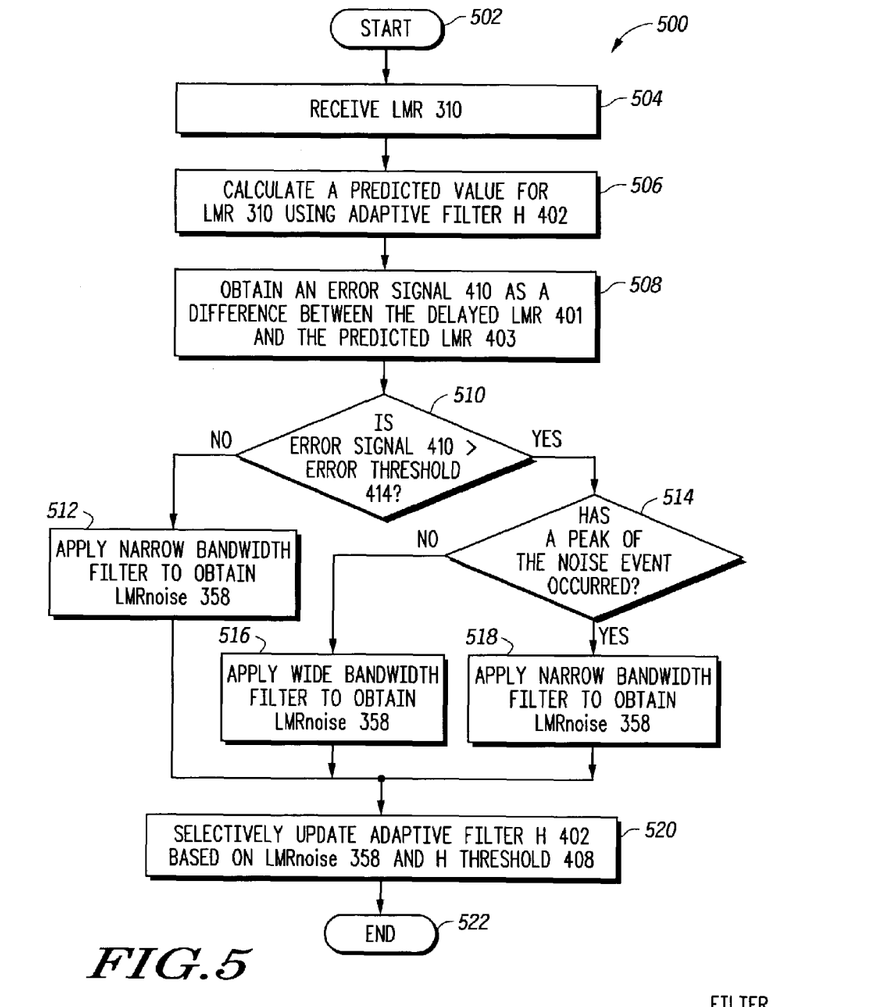
FIG. 5 illustrates, in flow diagram form, operation of the multipath noise detector of FIG. 4 in accordance with one embodiment of the present invention.

FIG. 5 begins with start 502 and flow proceeds to block 504 where LMR 310 is received. That is, a sample of LMR 310 that is to be processed is received. Therefore, note that the flow of FIG. 5 will be described in reference to a particular sample of LMR 310 and can therefore be repeated on a per sample basis. Alternatively, the flow of FIG. 5 may be repeated every k samples where k is any sampling constant.

After block 504, flow proceeds to block 506 where a predicted value for LMR 310 (predicted LMR 403) is calculated using an adaptive filter H 403. Therefore, referring to predictor 436 of FIG. 4, LMR 310 is provided to both delay 400 and adaptive filter H 402. The output of adaptive filter H 402 is predicted LMR 403 which is provided to summer 404. Note that adaptive filter H 402 selectively adapts based on the input received from H controller 404. H controller 404 selectively provides feedback from the output of summer 404 (i.e. error signal 410) to adaptive filter H 402 based on the output of comparator 406. Therefore, if H controller 404 provides error signal 410 to adaptive filter H 402, then adaptive filter H 402 adapts based on this feedback. However, if the output of comparator 406 indicates that no adapting should be performed (based on the values of LMRnoise 358 and H threshold 408), then H controller 404 does not provide the feedback to adaptive filter H 402. In this case, H controller 404 may instead provide zero values to adaptive filter H 402. Note that operation of predictor controller 438 will be described in more detail further below in reference to block 520 of FIG. 5.

In one embodiment, the following equations may be used to implement adaptive filter H 402 as an adaptive linear predictor.

$$y(n) = \sum_{k=1}^{N} H(k)y(n-k) \quad \text{Equation 1}$$

$$H(k) = H(k) - \mu * \text{sign}(y(n) - x(n-\tau_d)) * y(n-k) \quad \text{Equation 2}$$

Equation 1 represents the prediction output equation and equation 2 represents the filter update equation. In equations 1 and 2 above, H(n) is the nth tap of an FIR (Finite Impulse Response) adaptive filter of size N, y(n) is the predicted output (corresponding to predicted LMR 403), x(n) is the nth sample of the input signal (corresponding to LMR 310), and $\tau_d$ is the delay in samples. Note that, in one embodiment, $\tau_d$ is selected such that it compensates for the delay through adaptive filter H 402. Also, in equation 2, sign(x)=+1 if x>0, 0 if x=0, and −1 if x<0. Also, µ is the step size such that 0<µ<1, where, in one embodiment, µ, which controls the convergence of the predictive error, is set to an appropriate value and can be determined experimentally. In one embodiment, the filter is updated on a per sample basis. However in order to reduce the complexity of the implementation, the filter can be updated every k samples (e.g. every two samples, every three samples etc.). In order to incorporate this sub-sampling option, appropriate changes to the control algorithm may be needed, as known to one of ordinary skill in the art. Note also that the particular equations above (equations 1 and 2) describe an all-pole filter. However, the all-pole filter is given only by way of example, and alternate embodiments may use other types of filters.

Referring back to FIG. 5, after block 506, flow proceeds to block 508 where error signal 410 is obtained as a difference between delayed LMR 401 and predicted LMR 403. Therefore, referring to FIG. 4, LMR 310 is provided to delay 400. The output of delay 400 is delayed LMR 401. Delayed LMR 401 is provided to summer 404 which outputs the difference between delayed LMR 401 and predicted LMR 403 as error signal 410. Delay 400 ensures that delayed LMR 401 and predicted LMR 403 are time aligned, such that error signal 410 corresponds to the prediction error. Error signal 410 is then provided to predictor controller 438 and fast attack slow decay unit 434.

Referring again to FIG. 5, flow proceeds from block 508 to decision diamond 510 where it is determined whether error signal 410 is greater than a predetermined error threshold (such as error threshold 414 of FIG. 4). Therefore, decision diamond 510 is used to detect the onset of a noise event (i.e. the beginning of a noise event) or the continued occurrence of a noise event (i.e. if error signal 410 stays above the error threshold 414, then the noise event is still occurring.) Note that the predetermined error threshold can be selected through experimentation and may be programmable such that it can be adjusted. If, at decision diamond 510, error signal 410 is not greater than error threshold 414, then a noise event is not occurring, and flow proceeds to block 512. In block 512, a narrow bandwidth filter is applied to obtain LMRnoise 358. However, if, at decision diamond 510, error signal 410 does indicate the onset of a noise event or that a noise event is still occurring, then flow proceeds to decision diamond 514. In decision diamond 514, it is determined whether a peak of the currently occurring noise event has occurred. In one embodiment, a peak is detected by comparing the current sample of error signal 410 with a previous sample of error signal 410. If the current sample is greater than the previous sample, then error signal 410 is increasing and a peak has not been detected. However, if the previous sample is greater than the current sample, then a peak in error signal 410 is detected.

If no peak is detected at decision diamond 514, flow proceeds to block 516 where a wide bandwidth filter (wide as compared to the narrow-bandwidth filter of block 512) is applied to obtain LMRnoise 358. If a peak is detected at decision diamond 514, flow proceeds to block 518 where a narrow bandwidth filter (narrow as compared to the wide bandwidth filter of block 516) is applied to obtain LMRnoise 358. In one embodiment, the narrow bandwidth filter applied in block 518 is the same as the narrow bandwidth filter applied in block 512. However, in alternate embodiments, different narrow bandwidth filters may be used so long as they are narrower as compared to the wide bandwidth filter applied in block 516.

The wide and narrow bandwidth filters described above in reference to blocks 512, 516, and 518 are used to provide a fast attack slow decay mechanism for error signal 410 thus resulting in an improved psycho-acoustic perception of the audio signal. Also, the use of the fast attack slow decay allows for the approximation of the time location, duration, and magnitude of the noise event. For example, the onset of a impulsive-type noise event generally occurs quickly and suddenly. Therefore, upon detection of an onset of a noise event (decision diamond 510) a wide bandwidth filter is applied so as to quickly track the variations in error signal 410. However, when the noise event reaches a peak (i.e. when a peak in error signal 410 is detected), a narrow bandwidth filter is applied instead so as to smooth the variations in error signal 410 occurring after the peak. Note that during the occurrence of a noise event (i.e. while error signal 410 remains above error threshold 414) and after detection of a peak, despite the application of a narrow bandwidth filter to smooth the decay of error signal 410, the smoothed error signal 410 may again begin to increase. In this case, when the smoothed error signal 410 again begins to increase, the current value of smoothed error signal 410 is no longer less than the previous value of the smoothed error signal 410, and thus a wide bandwidth filter is again applied (in block 516) to track the rapid variations in error signal 410. Therefore, during the occurrence of a noise event, various peaks may occur. In this case, decision diamond 510 and 514, and blocks 512, 516, and 518 of FIG. 5, may apply a wide bandwidth filter or a narrow, bandwidth filter, as needed.

Therefore, when there are no multipath noise events present in LMR 310, the prediction error (error signal 410) is a "white noise" type of signal. However, when a multipath noise event is present, they appear in the error signal 410 because they cannot be predicted by a linear predictor (e.g. by adaptive filter H 402, if implemented as a linear predictor). This allows for the detection of a multipath noise event when present, and the fast attack slow decay mechanism provides an indication of the duration of the noise event. As a result, LMRnoise 358 can have a high magnitude in the duration where the noise event is present and a low magnitude otherwise. LMRnoise 358 can then be used by weak signal processor 356 to generate appropriate control signals for LPR filter 316, gain adjust 320, LMR filter 328, and gain adjust 332, as will be described in more detail below.

Note that FIG. 4 illustrates one embodiment of a fast attack slow decay unit 434 that may be used to implement decision diamonds 510 and 514 and blocks 512, 516, and 518 of FIG. 5. Comparator 412 compares error signal 410 with error threshold 414 (corresponding to decision diamond 510). Depending on the result of comparator 412 (communicated as filter select control 405 to filter select 420), filter select 420 provides error signal 410 to either narrow bandwidth filter 422 (corresponding to block 512 of FIG. 5) or to filter select 426 and comparator 424 (corresponding to decision diamond 514 of FIG. 5). Therefore, in one embodiment, filter select 420 may be a demultiplexer that provides error signal 410 to one of two paths depending on the value of filter select control 405 determined by comparator 412. Also, note that error threshold 414 may be a programmable threshold stored in a memory location within baseband unit 116. Alternatively, it may be a fixed value.

Therefore, if filter select control 405 indicates that filter select 420 should provide error signal 410 to filter select 426 and comparator 424, then comparator 424 compares error signal 410 with previous error signal 416 provided by delay 418 (corresponding to decision diamond 514). Therefore, in one embodiment, delay 418 corresponds to a storage unit within baseband unit 116 that stores a previous sample of error signal 410. Comparator 424 can therefore compare the current sample of error signal 410 with a previous sample of error signal 410 to determined if a peak of the noise event (i.e. a peak of error signal 410) has occurred. Depending on the result of comparator 424 (communicated as filter select control 407 to filter select 426), filter select 426 provides error signal 410 to either narrow bandwidth filter 428 (corresponding to block 518 of FIG. 5) or to wide bandwidth filter 430 (corresponding to block 516 of FIG. 5). Therefore, in one embodiment, filter select 426 may also be a demultiplexer that provides error signal 410 to one of two paths depending on the value of filter select control 407 determined by comparator 424. Output select 432 can then be used to select the output of the appropriate filter (of narrow bandwidth filter 422, narrow bandwidth filter 428, or wide bandwidth filter 430) as LMRnoise 358 depending on the values of filter select controls 405 and 407. Therefore, in one embodiment, output select 432 may be a multiplexer that provides the appropriate filter output as LMRnoise 358 depending on the filter used for the current sample of error signal 410, as determined by the flow of FIG. 5.

Referring back to FIG. 5, after blocks 512, 516, or 518, flow proceeds to block 520, where adaptive filter H 402 is selectively updated based on LMRnoise 358 and H threshold 408. As seen in FIG. 4, comparator 406 receives H threshold 408, which may be a programmable threshold, and LMRnoise 358 and compares LMRnoise 358 to H threshold 408. Based on this comparison, comparator 406 provides an indicator to H controller 404 such that H controller 404 either allows adaptive filter H 402 to adapt based on error signal 410 or not to adapt. For example, in one embodiment, if LMRnoise 358 is less than H threshold 408, then comparator 406 provides an indicator to H controller 404 to allow H controller 404 to provide error signal 410 to adaptive filter H 402. However, in this example, if LMRnoise 358 is not less than H threshold 408, then the indicator to H controller 404 from comparator 406 prevents H controller 404 from providing error signal 410 to adaptive filter H 402. In this case, H controller 404 may instead provide zeros to adaptive filter H 402 so that no adapting occurs. In this manner, a value for H threshold 408 may be selected such that adaptive filter H 402 selectively adapts to error signal 410 and thus may be protected from the impulsive type noise of error signal 410. The flow of FIG. 5 then ends with end 522. The flow of FIG. 5 begins at start 502 again upon receiving a next sample of LMR 310 to be processed.

Figure 6:
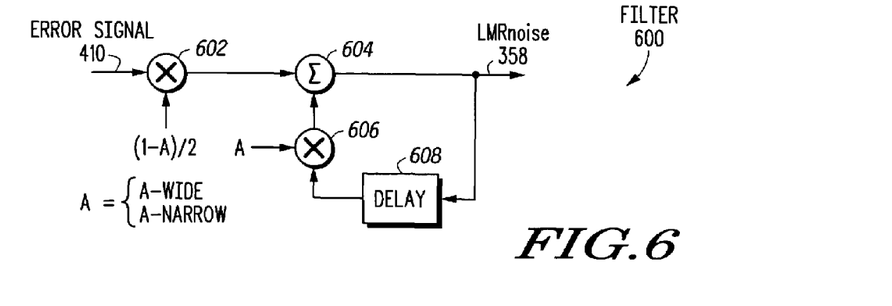
FIG. 6 illustrates one embodiment of a filter that may be used in the multipath noise detector of FIG. 4.

FIG. 6 provides one embodiment of a filter 600 that may be used for narrow bandwidth filters 422 and 428 and wide bandwidth filter 430. Filter 600 includes multipliers 602 and 606, summer 606, and delay 608. Multiplier 602 receives a current sample of error signal 410 and the value (1−A)/2 and provides the output, "current sample of error signal 410*(1−A)/2" to summer 604. Summer 604 also receives the result of multiplier 606 which receives the output of delay 608 (corresponding to a previous sample of LMRnoise 358) and the value A. Therefore, summer 604 outputs LMRnoise 358 as the sum of "current sample of error signal 410*(1−A)/2" and "A*previous sample of LMRnoise 358". Therefore, depending on the value of A, filter 600 may be used to implement either the wide bandwidth or narrow bandwidth filters. For example, for the wide bandwidth filter, a value of "A-WIDE" is used for A and for the narrow bandwidth filters, a value of "A-NARROW" is used for A, where the values of WIDE and NARROW can be set depending on the desired bandwidths of the filters. Furthermore, each of the narrow bandwidth filters may use different values of NARROW so long as they each result in a narrower bandwidth than the wide bandwidth filter. The values of WIDE and NARROW may be stored in a storage unit that may be fixed or programmable. Also, filter 600 allows for a same filter to be shared by filters 422, 428, and 430 where the intermediate value corresponding to delay 608 may be shared. That is, the delayed value of LMRnoise 358 at the output of delay 608 may be stored in a storage unit (e.g. within baseband unit 116) such that this value may be shared by both the narrow and wide filters.

The equations used for the filters 422, 428, and 430 may also be expressed as follows:

$$y(n) = \left(\frac{1-\alpha}{2}\right) * x(n) + \alpha * y(n-1) \qquad \text{Equation 3}$$

In equation 3, $\alpha=\alpha_{Narrow}$ for the narrow bandwidth filters and $\alpha=\alpha_{Wide}$ for wide bandwidth filter, where $0<\alpha<1$ and where $\alpha_{Wide}<\alpha_{Narrow}$. For example, in one embodiment $\alpha_{Wide}$ is set to 0.414, and $\alpha_{Narrow}$ is set to 0.9999. Also, in equation 3, x(n) is the nth input sample of the filter (such as, e.g., the nth sample of error signal 410), and y(n) is the nth output sample of the filter (such as, e.g., the nth sample of LMRnoise 358).

As mentioned above, LMRnoise 358 is provided to weak signal processor 356 which may use the information provided by LMRnoise 358, to provide control signals 342, 344, 346, and 348. LMRnoise 358 may be used in a variety of different ways according to a variety of different algorithms. One embodiment uses the following equations to generate control signals 342 and 346.

$$\text{Control\_LMR} = \text{RSSI} - f_{LMR}(\text{usn}) - g_{LMR}(\text{LMRnoise}) \qquad \text{Equation 4}$$

Equation 4 represents the signal quality of LMR 308. In one embodiment, it can be assumed that Control_LMR is a positive real-valued quantity normalized to one. Generally, the higher the value of Control_LMR, the better the signal quality. In equation 4, RSSI refers to Radio Signal Strength Indication, which, in the current embodiment, is assumed to be normalized in range of −1 to 0. Generally, the bigger the RSSI, the stronger the radio signal. In one embodiment $f_{LMR}$ and $g_{LMR}$ may be defined as follows.

$$f_{LMR}(\text{usn}) = \text{scale}_{f_{LMR}} * \text{usn} \qquad \text{Equation 5}$$

$$g_{LMR}(\text{LMRnoise}) = \text{scale}_{g_{LMR}} * \text{LMRnoise} \qquad \text{Equation 6}$$

In equations 5 and 6 above, $\text{scale}_{f_{LMR}}$ and $\text{scale}_{g_{LMR}}$ may be values between 0 and 1, and may be determined experimentally. Note that LMRnoise corresponds to LMRnoise 358. Also, usn refers to Ultrasonic noise. Based on Control_LMR, the values for control signals 342 and 346 may be derived by appropriate functions G1, G2 based on listening criteria. Therefore, the quality measure, Control_LMR, may be appropriately mapped to control the bandwidth and scaling of LMR 310. For example, the following equations may be used.

$$\text{LMR filter control } 342 = G1(\text{Control\_LMR}) \qquad \text{Equation 7}$$

$$\text{LMR gain control } 346 = G2(\text{Control\_LMR}) \qquad \text{Equation 8}$$

In equations 7 and 8 above, G1 and G2 may be monotonically decreasing functions of the argument. That is, as the quality of the signal decreases (i.e. as Control_LMR decreases), the bandwidth of LMR filters 328 and gain of gain adjust 332 decrease (as controlled by LMR filter control 342 and LMR gain control 346, respectively). These functions, G1 and G2, may also be determined experimentally. For example, G1 may be defined such that G1 (Control_LMR)= max_BW if Control_LMR>threshold1; G1(Control_LMR)= min_BW+c*(Control_LMR−threshold2) if threshold2<Control_LMR<threshold1; and G1(Control_LMR)=min_BW if Control_LMR<threshold2. In this example, c=(max_BW−min_BW)/(threshold1−threshold2), and 0<threshold2<threshold1<1. In one embodiment, max_BW=15 KHz, min_BW=5 KHz, threshold1=−0.2, and threshold2=−0.3. Note that function G2 can be similarly defined using the same or different constant values. Also, note that alternate embodiments may use different equations and constants than those described in this example.

Therefore, note that weak signal processor 356 may be used to decrease the bandwidth and/or attenuate LMR 310 via LMR filter 328 and gain adjust 332 for the duration that the noise event is present, as indicated by the above equations. By using LMRnoise 358 in this manner, the fidelity of the audio signal is not sacrificed because the weak signal processor algorithm is aggressive only to the degree and for the duration indicated by LMRnoise 358.

The above descriptions of FIGS. 4-6 only addressed processing LMR 310 and LMRnoise 358. In one embodiment, only LMR 310 is processed to produce LMRnoise 358 where LMRnoise 358 is then used to control both LMR 310 and LPR 308 via LPR filter 316, LMR filter 328, gain adjust 320, and gain adjust 332. In the embodiment which uses noise detector 350 to detect multipath noise events, the processing of just LMR 310 still provides an improved audio signal because, in one embodiment, there is a correlation between the occurrence of a multipath noise event in the LPR and LMR signals such that detecting a multipath noise occurrence in the LMR signal also indicates a multipath noise occurrence in the LPR signal. Also, since the LMR signal is translated to a higher frequency band, it can be more susceptible to the effects of multipath noise and therefore the multipath noise events may be more noticeable in the LMR signal (LMR 310). In this embodiment, Control_LMR of equation 4 may be used to generate LPR filter control 344 and LPR gain control 348, where, in one embodiment, equations similar to equations 7 and 8 may be used.

However, in alternate embodiments, LPR 308 may be processed analogously to LMR 310. That is, LPR 308 can be processed according to the flow of FIG. 5, and an implementation, like that of FIG. 4, can also be used to process LPR 308 to produce LPRnoise 352. In this embodiment, LMRnoise 358 may be used to control LMR 310 via LMR filter 328 and gain adjust 332 and LPRnoise 352 may be used to control LPR 308 via LPR filter 316 and gain adjust 320. For example, the following equations (analogous to equations 4-8) may be used.

$$\text{Control\_LPR} = \text{RSSI} - f_{LPR}(\text{usn}) - g_{LPR}(\text{LPRnoise}) \qquad \text{Equation 9}$$

Equation 9, analogous to equation 4, represents the signal quality of LPR 310. Therefore, in one embodiment, it can be assumed that Control_LPR is a positive real-valued quantity normalized to one. Generally, the higher the value of Control_LPR, the better the signal quality. (Also, note that RSSI and usn are as described above in reference to equation 4.) In one embodiment $f_{LPR}$ and $g_{LPR}$ may be defined as follows (analogous to equations 5 and 6).

$$f_{LPR}(\text{usn}) = \text{scale}_{f_{LPR}} * \text{usn} \qquad \text{Equation 10}$$

$$g_{LPR}(\text{LPRnoise}) = \text{scale}_{g_{LPR}} * \text{LPRnoise} \qquad \text{Equation 11}$$

In equations 10 and 11 above, $\text{scale}_{f_{LPR}}$ and $\text{scale}_{g_{LPR}}$ may be values between 0 and 1, and may be determined experimentally. Note that LPRnoise corresponds to LPRnoise 352. Based on Control_LPR, the values for control signals 344 and 348 may be derived by appropriate functions H1, H2 based on listening criteria. Therefore, in this embodiment, the quality measure, Control_LPR, may be appropriately mapped to control the bandwidth and scaling of LPR 308. For example, the following equations, analogous to equations 7 and 8, may be used.

$$\text{LPR filter control } 344 = H1(\text{Control\_LPR}) \qquad \text{Equation 12}$$

$$\text{LPR gain control } 348 = H2(\text{Control\_LPR}) \qquad \text{Equation 13}$$

In equations 12 and 13 above, H1 and H2 may also be monotonically decreasing functions of the argument. That is, as the quality of the signal decreases (i.e. as Control_LPR decreases), the bandwidth of LPR filters 316 and gain of gain adjust 320 decrease (as controlled by LPR filter control 344 and LPR gain control 348, respectively). These functions, H1 and H2, may also be determined experimentally. In one embodiment, H1 and H2 are defined similar to functions G1 and G2 described above. For example, according to one embodiment, the same equations used for G1 may be used for H1, where, in the definition of H1, max_BW=15 kHz, min_BW=5 kHz, threshold1=−0.4, and threshold2=−0.5. Therefore, H2 may also be similarly defined. Also, note that alternate embodiments may use different equations and constants than those used in this example.

In this embodiment where LPRnoise 352 is used to control LPR filter control 344 and LPR gain control 358, the same filters and thresholds may be used as those used for obtaining LMRnoise 358 and LPRnoise 352 and processing LPR 308 and LMR 310, or, alternatively, different values may be used. In this embodiment, some or all of the resources used to process LMR 310 may be shared with resources used to process of LPR 308.

Therefore, it can be appreciated how a fast attack slow decay mechanism can be implemented to improve psycho-acoustic perception of the audio signal and to better detect and gauge location, duration, and magnitude of noise events, such as impulsive-type noise events. Note also that at least some of the embodiments described herein use the post-demodulated signals to provide the fast attack slow decay mechanism. The use of post-demodulated signals can provide control signals that are more accurate and more sensitive to the noise, thus resulting in improved noise control information provided by signals such as LMRnoise 358 and LPRnoise 352. For example, the use of post-demodulated signals also allows for the improved detection of impulsive-type noise.

Note that the various hardware units and circuitry described throughout the application can be reused or shared by various functions. Embodiments of the present invention can also be implemented in hardware, software, firmware, or in any combination of these. For example, some embodiments may be implemented by a finite state machine having control circuitry with microcode to control execution of the state machine. Alternatively, software code executing in a data processing system (such as, for example, a digital signal processor) may be used to perform the above functions. Furthermore, the software and/or firmware may be embodied on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the block diagrams may include different blocks than those illustrated and may have more or less blocks or be arranged differently. Also, the flow diagrams may also be arranged differently, include more or less steps, be arranged differently, or may have steps that can be separated into multiple steps or steps that can be performed simultaneously with one another.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A radio receiver for performing signal noise control, comprising:
   a predictor for receiving an input signal and providing an error signal;
   a fast attack slow decay unit which uses a first filter for the fast attack and a second filter for the slow decay, said fast attack slow decay unit is coupled to the predictor to receive the error signal, said fast attack slow decay unit provides a noise related control signal, wherein the second filter has a narrower bandwidth than the first filter, and wherein the input signal to the predictor is a post-demodulated signal;
   a variable filter for receiving the post-demodulated signal and for providing a filter output signal;
   gain adjust for receiving the filter output signal and providing a gain adjust output signal; and
   a weak signal processor for receiving the noise related control signal and providing a filter control signal to the variable filter and for providing a gain control signal to the gain adjust.

2. An apparatus as in claim 1, wherein the predictor is linear.

3. An apparatus as in claim 1, further comprising:
   a predictor controller, coupled to the predictor, to selectively adapt the predictor.

4. An apparatus as in claim 1, wherein the fast attack slow decay unit comprises:
   a first comparator, coupled to the predictor to receive the error signal, said first comparator determining if the error signal is above a first predetermined threshold.

5. An apparatus as in claim 4, wherein the fast attack slow decay unit further comprises:
   a second comparator, coupled to the predictor, said second comparator determining if the error signal is increasing.

6. An apparatus as in claim 5, further comprising:
   a third comparator, coupled to the fast attack slow decay unit, said third comparator determining if the noise related control signal is above a second predetermined threshold.

7. An apparatus as in claim 1, wherein the noise related control signal provides information regarding at least one of time location, magnitude, and duration of a noise event.

8. An apparatus as in claim 1, wherein the noise related control signal provides information regarding time location, magnitude, and duration of a noise event.

9. An apparatus as in claim 1, wherein the fast attack slow decay unit further comprises:
   storage, coupled to receive the noise related control signal, said storage storing a previous value of the noise related control signal, wherein the previous value of the noise related control signal is shared by the first and second filters.

10. An apparatus for performing signal noise control, the apparatus having a signal processing unit, the signal processing unit comprising:
    a variable filter for receiving a post-demodulated signal and for providing a filter output signal;
    gain adjust for receiving the filter output signal and providing a gain adjust output signal;
    noise detector for receiving the post-demodulated signal and providing a noise related control signal, wherein the noise detector further comprises:
        a predictor for receiving an input signal and providing an error signal; and
        a fast attack slow decay unit which uses a first filter for the fast attack and a second filter for the slow decay, said fast attack slow decay unit is coupled to the predictor to receive the error signal, said fast attack slow decay unit provides a noise related control signal, wherein the second filter has a narrower bandwidth than the first filter; and
    a weak signal processor for receiving the noise related control signal and providing a filter control signal to the variable filter and for providing a gain control signal to the gain adjust.

11. A method for signal noise control, comprising:
    receiving an input signal;
    delaying the input signal to produce a delayed input signal;
    calculating a predicted value of the input signal;
    obtaining an error signal based on a difference between the delayed input signal and the predicted value of the input signal;
    determining if the error signal indicates an onset of a noise event;
    if the onset of the noise event has not occurred, applying a first filter having a first bandwidth to the error signal to produce a noise related control signal;
    determining if a peak of the noise event has occurred;
    if the peak of the noise event has occurred, applying the first filter having the first bandwidth to the error signal to produce the noise related control signal; and
    if the peak of the noise event has not occurred, applying a second filter having a second bandwidth to the error signal to produce the noise related control signal,
    wherein the first bandwidth is narrower than the second bandwidth.

12. A method as in claim 11, wherein the method is used in a radio receiver.

13. A method as in claim 11, further comprising:
    selectively updating a filter used to calculate the predicted value of the input signal.

14. A method as in claim 13, wherein said step of selectively updating comprises:
    using the noise related control signal to determine whether updating of the filter will be performed.

15. A method as in claim 14, wherein said step of using the noise related control signal to determine whether updating of the filter will be performed comprises:
    determining if the noise related control signal has exceeded a predetermined threshold.

16. A method as in claim 15, wherein the predetermined threshold is programmable.

17. A method as in claim 11, wherein at least one of the first bandwidth and the second bandwidth is programmable.

* * * * *